US012690407B2

(12) United States Patent
     Kim et al.

(10) Patent No.:     US 12,690,407 B2
(45) Date of Patent:          Jul. 21, 2026

(54) APPARATUS AND METHOD FOR PROCESSING SUBSTRATE

(71) Applicants: SEMES CO., LTD., Cheonan-si (KR); SAMSUNG ELECTRONICS CO., LTD., Suwon-si (KR)

(72) Inventors: Min Jung Kim, Chungcheongnam-do (KR); Jin Ah Han, Chungcheongnam-do (KR); Hee Hwan Kim, Sejong-si (KR); Yong Hoon Hong, Seoul (KR); Kyoung Suk Kim, Suwon-si (KR); Jong Hyeok Park, Suwon-si (KR); Jin Hyung Park, Suwon-si (KR); Dae Hyuk Chung, Suwon-si (KR); Ji Hoon Cha, Suwon-si (KR)

(73) Assignees: SEMES CO., LTD., Cheonan-si (KR); SAMSUNG ELECTRONICS CO., LTD., Suwon-si (KR)

( * ) Notice: Subject to any disclaimer, the term of this patent is extended or adjusted under 35 U.S.C. 154(b) by 114 days.

(21) Appl. No.: 18/387,713

(22) Filed: Nov. 7, 2023

(65) Prior Publication Data

US 2024/0153792 A1      May 9, 2024

(30) Foreign Application Priority Data

Nov. 8, 2022    (KR) ......................... 10-2022-0148289

(51) Int. Cl.
     *H10P 72/00*          (2026.01)
     *H10P 50/64*          (2026.01)
(52) U.S. Cl.
     CPC ........ *H10P 72/0424* (2026.01); *H10P 50/642* (2026.01)

(58) Field of Classification Search
     None
     See application file for complete search history.

(56) References Cited

U.S. PATENT DOCUMENTS 10,639,683 B2      5/2020  Tsuchihashi et al.
10,707,101 B2      7/2020  Kim et al.
                   (Continued)

FOREIGN PATENT DOCUMENTS

JP        2016-192473 A       11/2016
JP        2020-87999 A         6/2020
                   (Continued)

OTHER PUBLICATIONS

Korean Office Action dated Mar. 29, 2024 in Korean Application No. 10-2022-0148289.

*Primary Examiner* — Sylvia Macarthur
(74) *Attorney, Agent, or Firm* — Sughrue Mion, PLLC

(57)          ABSTRACT

An apparatus and method for processing a substrate can reduce the concentration of process by-products in a chemical solution. The apparatus includes a substrate rotating device configured to rotate a seated substrate in a spinning manner, a chemical solution supply device configured to supply a chemical solution to the substrate, a chemical solution discharge line configured to discharge the chemical solution having undergone a process to an outside, a chemical solution circulation line configured to circulate the chemical solution having undergone the process to the chemical solution supply device, and a discharged chemical solution selection device configured to discharge a chemical solution containing a first amount of process by-products to the outside through the chemical solution discharge line and to circulate a chemical solution containing a second amount of process by-products through the chemical solution circu- (Continued)

lation line, wherein the first amount of process by-products is larger than the second amount of process by-products.

11 Claims, 9 Drawing Sheets

(56)                    References Cited

U.S. PATENT DOCUMENTS

| | | | |
|---|---|---|---|
| 11,018,034 B2 | 5/2021 | Endo et al. | |
| 2004/0187896 A1* | 9/2004 | Konishi | H01L 21/6708 |
| | | | 134/32 |
| 2018/0061675 A1* | 3/2018 | Kim | H01L 21/6708 |
| 2018/0085795 A1* | 3/2018 | Tsuchihashi | H01L 21/67023 |
| 2018/0358241 A1* | 12/2018 | Lee | H01L 21/67023 |
| 2019/0295862 A1* | 9/2019 | Endo | H01L 21/67028 |
| 2024/0153792 A1* | 5/2024 | Kim | H01L 21/67051 |

FOREIGN PATENT DOCUMENTS

| | | | |
|---|---|---|---|
| JP | 7170511 | B2 | 11/2022 |
| KR | 10-2008-0081695 | A | 9/2008 |
| KR | 10-2011-0136677 | A | 12/2011 |
| KR | 10-2018-0024060 | A | 3/2018 |
| KR | 10-2018-0034244 | A | 4/2018 |
| KR | 10-2019-0112635 | A | 10/2019 |

* cited by examiner

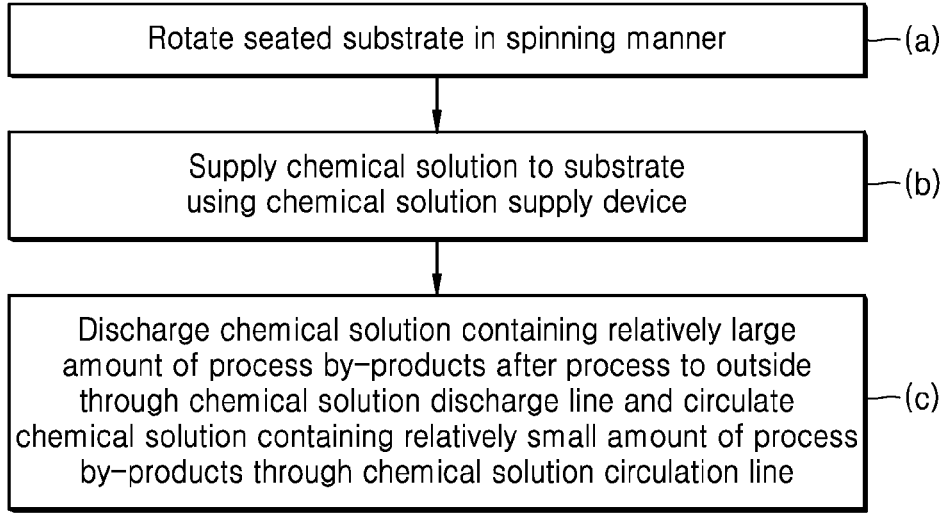

Rotate seated substrate in spinning manner —(a)

Supply chemical solution to substrate
using chemical solution supply device —(b)

Discharge chemical solution containing relatively large
amount of process by-products after process to outside
through chemical solution discharge line and circulate
chemical solution containing relatively small amount of process
by-products through chemical solution circulation line —(c)

FIG. 6

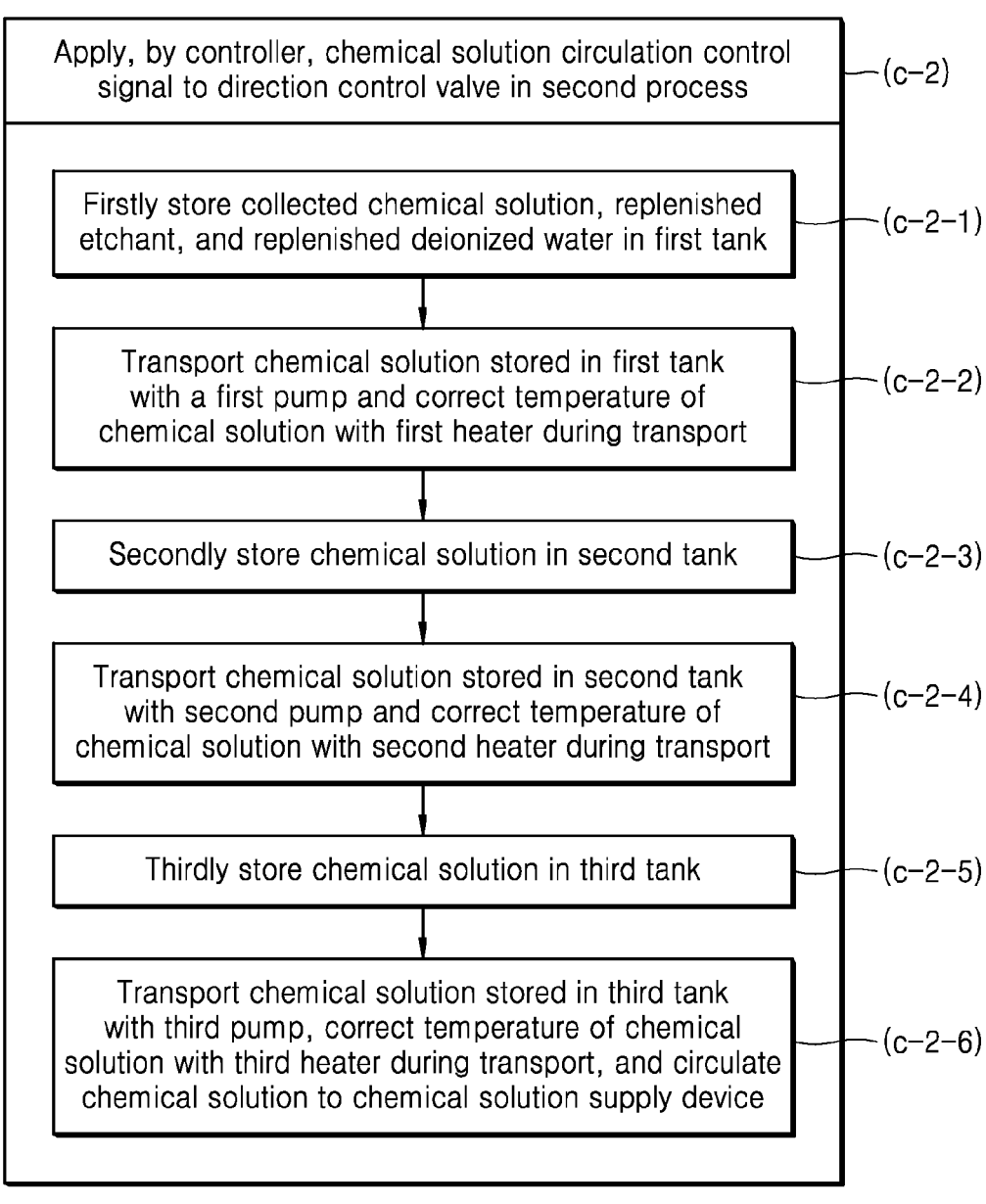

Apply, by controller, chemical solution circulation control signal to direction control valve in second process —(c-2)

Firstly store collected chemical solution, replenished etchant, and replenished deionized water in first tank —(c-2-1)

Transport chemical solution stored in first tank with a first pump and correct temperature of chemical solution with first heater during transport —(c-2-2)

Secondly store chemical solution in second tank —(c-2-3)

Transport chemical solution stored in second tank with second pump and correct temperature of chemical solution with second heater during transport —(c-2-4)

Thirdly store chemical solution in third tank —(c-2-5)

Transport chemical solution stored in third tank with third pump, correct temperature of chemical solution with third heater during transport, and circulate chemical solution to chemical solution supply device —(c-2-6)

FIG. 7

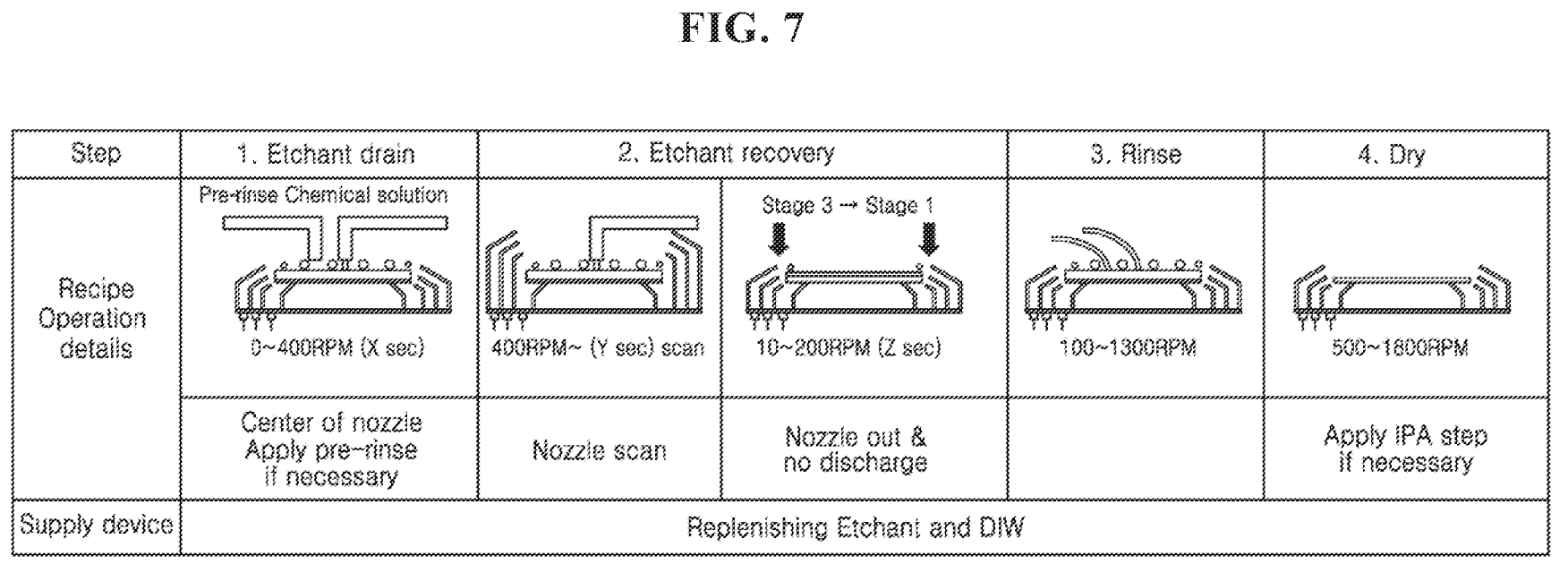

| Step | 1. Etchant drain | 2. Etchant recovery | | 3. Rinse | 4. Dry |
|---|---|---|---|---|---|
| Recipe Operation details | Pre-rinse Chemical solution<br><br>0~400RPM (X sec) | 400RPM~ (Y sec) scan | Stage 3 → Stage 1<br><br>10~200RPM (Z sec) | 100~1300RPM | 500~1800RPM |
| | Center of nozzle<br>Apply pre-rinse if necessary | Nozzle scan | Nozzle out &<br>no discharge | | Apply IPA step if necessary |
| Supply device | Replenishing Etchant and DIW | | | | |

APPARATUS AND METHOD FOR PROCESSING SUBSTRATE

CROSS-REFERENCE TO RELATED PATENT APPLICATION

This application claims priority from Korean Patent Application No. 10-2022-0148289, filed on Nov. 8, 2022, in the Korean Intellectual Property Office, the disclosure of which is incorporated herein by reference in its entirety.

BACKGROUND

1. Field

The present disclosure relates to an apparatus and method for processing a substrate, and more particularly, to an apparatus and method for processing a substrate that may reduce the concentration of process by-products in a chemical solution.

2. Description of the Related Art

As semiconductor devices become more dense, highly integrated, and perform better, the miniaturization of circuit patterns is accelerating, and process by-products and contaminants such as particles, organic contaminants, and metal contaminants that remain on the substrate surface have a significant impact on device characteristics and production yields. For this reason, the cleaning process of removing various contaminants attached to the surface of the substrate has become very important in the semiconductor manufacturing process, and the process of cleaning the substrate is carried out before and after each unit process of manufacturing semiconductors.

Chemical solutions such as etching solution (etchant) are very expensive. Thus, for economic reasons, after performing the etching process, the chemical solutions are collected together and recycled back to a chemical solution supply device using a chemical solution circulation line.

SUMMARY

However, in this conventional method of recycling the chemical solution, the chemical solution is collected and recycled regardless of the type of process or the amount of other process by-products contained in the chemical solution. Thus, the concentration of process by-products in the chemical solution is rapidly increased, resulting in a very short remaining life of the etching function and a very short management cycle for maintenance and replenishment of new chemical solution to maintain the etching rate.

In addition, in conventional cases, a pre-rinse solution cannot be used to recover the entire amount of chemical solution, and the chemical solution must be changed very frequently to maintain a constant Ti concentration.

Therefore, the present disclosure has been made in view of the above problems, and it is an object of the present disclosure to provide an apparatus and method for processing a substrate that may reduce the waiting time for input by reducing the total number of times the chemical solution is replaced due to frequent replenishment of the solution by discharging, to the outside, a chemical solution collected in an initial etching process and containing a large amount of process by-product, and recycling a chemical solution containing a small amount of process by-products. However, this object is exemplary and is not intended to limit the scope of the present disclosure.

In accordance with an aspect of the present disclosure, the above and other objects can be accomplished by the provision of an apparatus for processing a substrate. The apparatus may include a substrate rotating device configured to rotate a seated substrate in a spinning manner, a chemical solution supply device configured to supply a chemical solution to the substrate, a chemical solution discharge line configured to discharge the chemical solution having undergone a process to an outside, a chemical solution circulation line configured to circulate the chemical solution having undergone the process to the chemical solution supply device, and a discharged chemical solution selection device configured to discharge a chemical solution containing a first amount of process by-products to the outside through the chemical solution discharge line and to circulate a chemical solution containing a second amount of process by-products through the chemical solution circulation line, wherein the first amount of process by-products is larger than the second amount of process by-products.

According to the present disclosure, the discharged chemical solution selection device may be a direction control valve configured to discharge, in a chemical solution discharge mode, the chemical solution containing the first amount of process by-products from a first process to the outside through the chemical solution discharge line and to circulate, in a chemical solution circulation mode, the chemical solution containing the second amount of process by-products from a second process through the chemical solution circulation line.

According to the present disclosure, the direction control valve may be a three-way valve configured to allow, in the first process, an input side connected to a chemical solution collection line to communicate with the chemical solution discharge line and to allow, in the second process, the input side to communicate with the chemical solution circulation line.

According to the present disclosure, the apparatus may further include a controller configured to apply a chemical solution discharge control signal to the direction control valve in the first process and a chemical solution circulation control signal to the direction control valve in the second process.

According to the present disclosure, the first process may include an initial etching process of discharging a chemical solution onto the rotating substrate through a nozzle of the chemical solution supply device positioned over a center of the substrate, or a pre-rinse process of discharging a rinse solution onto the substrate through the nozzle, wherein the second process may include a first intermediate etching process of discharging the chemical solution onto the rotating substrate while the nozzle moves in a scanning manner from a position over the center of the substrate to a position over an edge of the substrate, and a second intermediate etching process. In the second intermediate etching process, the nozzle may move away from an area over the substrate and the substrate may continue to rotate.

According to the present disclosure, in the initial etching process, the substrate may be rotated at a first rotational speed for a first time. In the first intermediate etching process, the substrate may be rotated at a second rotational speed higher than the first rotational speed for a second time. In the second intermediate etching process, the substrate may be rotated at a third rotational speed lower than the first rotational speed for a third time.

According to the present disclosure, the controller may determine a rotational speed of the substrate and apply a chemical solution discharge control signal or a chemical solution circulation control signal to the direction control valve.

According to the present disclosure, the controller may determine a type of a process currently in progress and apply the chemical solution discharge control signal or the chemical solution circulation control signal to the direction control valve.

According to the present disclosure, the discharged chemical solution selection device may include a first collection basin configured to be elevated up to a first height by an elevating device, a first chemical solution discharge line connected to the first collection basin, a second collection basin disposed on an outer side of the first collection basin, the second collection basin being configured to be elevated up to a second height greater than the first height by the elevating device, a second chemical solution discharge line connected to the second collection basin, a third collection basin disposed on an outer side of the second collection basin, the third collection basin being configured to be elevated up to a third height greater than the second height by the elevating device, and a third chemical solution discharge line connected to the third collection basin.

According to the present disclosure, the discharged chemical solution selection device may further include a controller configured to apply an elevation control signal to the elevating device to raise and lower the first collection basin, the second collection basin, and the third collection basin according to the process such that the chemical solution containing the first amount of process by-products is discharged to the outside through the chemical solution discharge line, and the chemical solution containing the second amount of process by-products is circulated through the chemical solution circulation line.

According to the present disclosure, the chemical solution circulation line may include an etchant replenishment line allowing etchant to be replenished therethrough, a deionized water replenishment line allowing deionized water to be replenished therethrough, a first tank configured to firstly store a collected chemical solution, the replenished etchant, and the replenished deionized water, a first transport line configured to transport the chemical solution stored in the first tank with a first pump and correct a temperature of the chemical solution with a first heater during the transport, a second tank configured to secondly store the chemical solution, a second transport line configured to transport the chemical solution stored in the second tank with a second pump and correct the temperature of the chemical solution with a second heater during the transport, a third tank configured to thirdly store the chemical solution, and a third transport line configured to transport the chemical solution stored in the third tank with a third pump, correct the temperature of the chemical solution with a third heater during the transport, and circulate the chemical solution to the chemical solution supply device.

In accordance with another aspect of the present disclosure, provided herein is a method of processing a substrate. The method may include (a) rotating a seated substrate in a spinning manner, (b) supplying a chemical solution to the substrate using a chemical solution supply device, and (c) discharging the chemical solution containing a first amount of process by-products after a process to an outside through a chemical solution discharge line and circulating the chemical solution containing a second amount of process by-products through a chemical solution circulation line, wherein the first amount of process by-products is larger than the second amount of process by-products.

According to the present disclosure, in step (c), in a chemical solution discharge mode, the chemical solution containing the first amount of process by-products from a first process may be discharged to the outside by a direction control valve through the chemical solution discharge line. In a chemical solution circulation mode, the chemical solution containing the second amount of process by-products from a second process may be circulated through the chemical solution circulation line by the direction control valve.

According to the present disclosure, step (c) may include (c-1) applying, by a controller, a chemical solution discharge control signal to the direction control valve in the first process, and (c-2) applying, by the controller, a chemical solution circulation control signal to the direction control valve in the second process.

According to the present disclosure, step (c-1) may include an initial etching process of discharging a chemical solution onto the rotating substrate through a nozzle of a chemical solution supply device positioned over a center of a wafer, or a pre-rinse process of discharging a rinse solution onto the substrate through the nozzle. Step (c-2) may include a first intermediate etching process of discharging the chemical solution onto the rotating substrate while the nozzle moves in a scanning manner from a position over the center of the wafer to a position over an edge of the wafer, and a second intermediate etching process. In the second intermediate etching process, the nozzle may move away from an area over the wafer and the substrate may continue to rotate.

According to the present disclosure, in the initial etching process, the substrate may be rotated at a first rotational speed for a first time. In the first intermediate etching process, the substrate may be rotated at a second rotational speed higher than the first rotational speed for a second time. In the second intermediate etching process, the substrate may be rotated at a third rotational speed lower than the first rotational speed for a third time.

According to the present disclosure, the first rotational speed may be less than about 400 revolutions per minute (rpm), the second rotational speed may be about 400 rpm or more, and the third rotational speed may be less than about 200 rpm. About X revolutions per minute (rpm) means±10% range of X. For example, about 400 rpm means 360 rpm to 440 rpm.

According to the present disclosure, in step (c), a first collection basin, a second collection basin, and a third collection basin may be raised and lowered according to the process to discharge the chemical solution containing the first amount of process by-products to the outside through the chemical solution discharge line and to circulate the chemical solution containing the second amount of process by-products through the chemical solution circulation line.

According to the present disclosure, step (c-2) may include (c-2-1) firstly storing a collected chemical solution, replenished etchant, and replenished deionized water in a first tank, (c-2-2) transporting the chemical solution stored in the first tank with a first pump and correcting a temperature of the chemical solution with a first heater during the transport, (c-2-3) secondly storing the chemical solution in a second tank, (c-2-4) transporting the chemical solution stored in the second tank with a second pump and correcting the temperature of the chemical solution with a second heater during the transport, (c-2-5) thirdly storing the chemical solution in a third tank, and (c-2-6) transporting the chemical solution stored in the third tank with a third pump, correcting the temperature of the chemical solution with a third heater during the transport, and circulating the chemical solution to a chemical solution supply device.

In accordance with another aspect of the present disclosure, provided herein is an apparatus for processing a substrate. The apparatus may include a substrate rotating device configured to rotate a seated substrate in a spinning manner, a chemical solution supply device configured to supply a chemical solution to the substrate, a chemical solution discharge line configured to discharge the chemical solution having undergone a process to an outside, a chemical solution circulation line configured to circulate the chemical solution having undergone the process to the chemical solution supply device, and a discharged chemical solution selection device configured to discharge a chemical solution containing a first amount of process by-products to the outside through the chemical solution discharge line and to circulate a chemical solution containing a second amount of process by-products through the chemical solution circulation line, wherein the first amount of process by-products is larger than the second amount of process by-products. The discharged chemical solution selection device may be a direction control valve configured to discharge, in a chemical solution discharge mode, the chemical solution containing first amount of process by-products from a first process to the outside through the chemical solution discharge line and to circulate, in a chemical solution circulation mode, the chemical solution containing the second amount of process by-products from a second process through the chemical solution circulation line. The apparatus may further include a controller configured to apply a chemical solution discharge control signal to the direction control valve in the first process and a chemical solution circulation control signal to the direction control valve in the second process. The first process may include an initial etching process of discharging a chemical solution onto the rotating substrate through a nozzle of the chemical solution supply device positioned over a center of a wafer. The second process may include a first intermediate etching process of discharging the chemical solution onto the rotating substrate while the nozzle moves in a scanning manner from a position over the center of the wafer to a position over an edge of the wafer, and a second intermediate etching process. In the second intermediate etching process, the nozzle may move away from an area over the wafer and the substrate may continue to rotate. The discharged chemical solution selection device may include a first collection basin configured to be elevated up to a first height by an elevating device, a first chemical solution discharge line connected to the first collection basin, a second collection basin disposed on an outer side of the first collection basin, the second collection basin being configured to be elevated up to a second height greater than the first height by the elevating device, a second chemical solution discharge line connected to the second collection basin, a third collection basin disposed on an outer side of the second collection basin, the third collection basin being configured to be elevated up to a third height greater than the second height by the elevating device, and a third chemical solution discharge line connected to the third collection basin. The controller may be configured to apply an elevation control signal to the elevating device to raise and lower the first collection basin, the second collection basin, and the third collection basin according to the process such that the chemical solution containing the first amount of process by-products is discharged to the outside through the chemical solution discharge line, and the chemical solution containing the second amount of process by-products is circulated through the chemical solution circulation line. The chemical solution circulation line may include an etchant replenishment line allowing etchant to be replenished therethrough, a deionized water replenishment line allowing deionized water to be replenished therethrough, a first tank configured to firstly store a collected chemical solution, the replenished etchant, and the replenished deionized water, a first transport line configured to transport the chemical solution stored in the first tank with a first pump and correct a temperature of the chemical solution with a first heater during the transport, a second tank configured to secondly store the chemical solution, a second transport line configured to transport the chemical solution stored in the second tank with a second pump and correct the temperature of the chemical solution with a second heater during the transport, a third tank configured to thirdly store the chemical solution, and a third transport line configured to transport the chemical solution stored in the third tank with a third pump, correct the temperature of the chemical solution with a third heater during the transport, and circulate the chemical solution to the chemical solution supply device.

BRIEF DESCRIPTION OF DRAWINGS

The above and other objects, features and other advantages of the present disclosure will be more clearly understood from the following detailed description taken in conjunction with the accompanying drawings, in which:

FIG. 1 is a plan view illustrating a substrate processing facility according to some embodiments of the present disclosure;

FIG. 3 a hydraulic circuit diagram illustrating the substrate processing apparatus of FIG. 2;

FIG. 4 is a flowchart illustrating a substrate processing method according to some embodiments of the present disclosure;

FIG. 6 is a flowchart illustrating step (c-2) in the substrate processing method of FIG. 5 in more detail;

FIG. 7 is a table illustrating a substrate processing method according to some other embodiments of the present disclosure.

DETAILED DESCRIPTION

Figure 2:
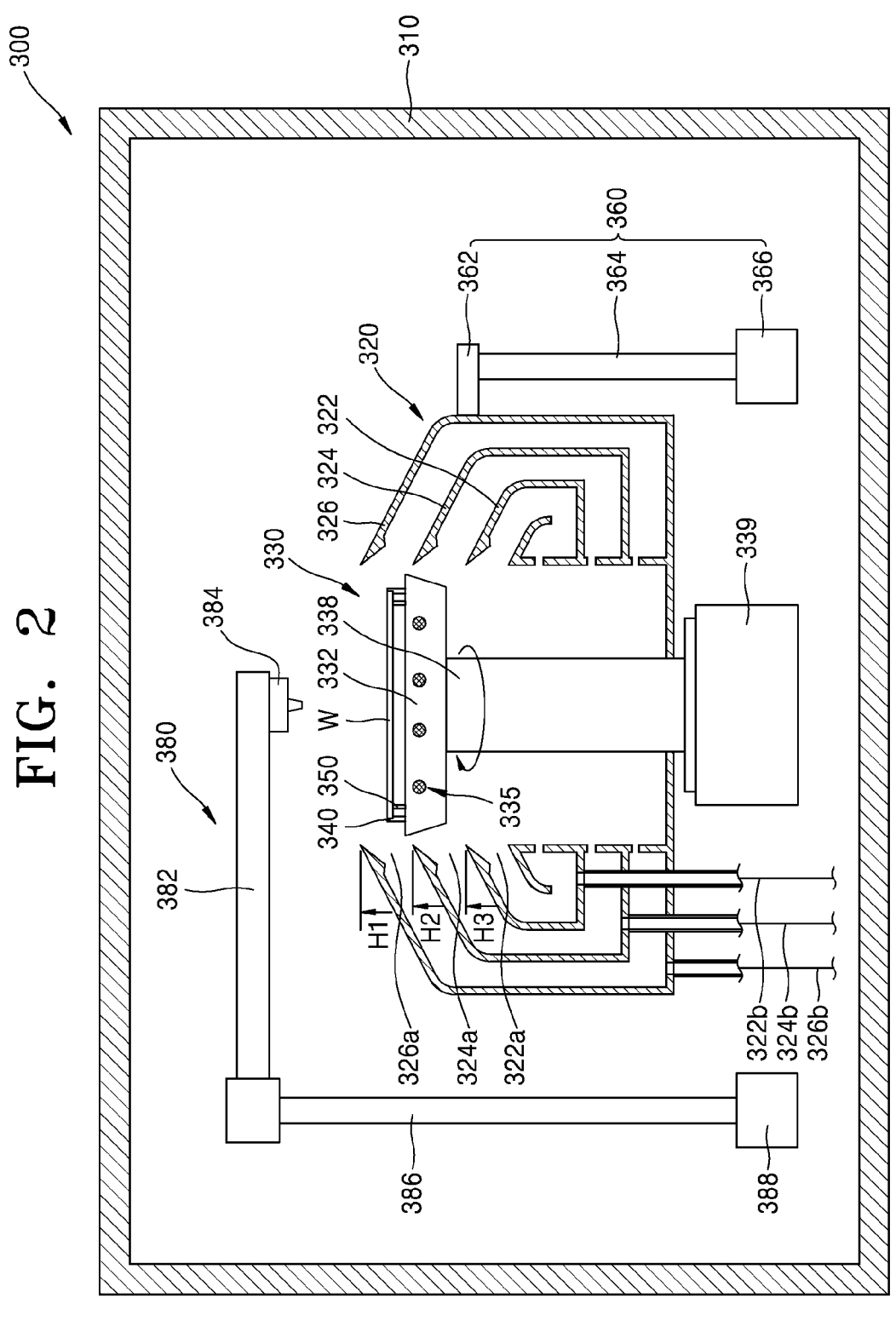
FIG. 2 is a cross-sectional view illustrating a substrate processing apparatus applicable to the substrate processing facility of FIG. 1.

Hereinafter, several preferred embodiments of the present disclosure will be described in detail with reference to the accompanying drawings.

The embodiments of the present disclosure are provided to provide a thorough understanding of the present disclosure to those skilled in the art. Various modifications may be made to the following embodiments, and the scope of the present disclosure is not limited to the following embodiments. Rather, these embodiments are provided to make a complete disclosure and to fully convey the ideas of the disclosure to those skilled in the art. In addition, the thickness or size of each layer in the drawings is exaggerated for ease of illustration and clarity.

The terms used herein are intended to describe specific embodiments and are not intended to limit the present disclosure. As used herein, the singular form may encompass a plural form, unless the context clearly indicates otherwise. In addition, as used herein, the words "comprise" and/or "comprising" are intended to specify the presence of the mentioned figures, numbers, steps, operations, members, elements, and/or groups thereof, and not to exclude the presence or addition of one or more other figures, numbers, operations, members, elements, and/or groups.

Hereinafter, embodiments of the present disclosure will be described with reference to the drawings, which schematically illustrate idealized embodiments of the present disclosure. In the drawings, variations in the illustrated geometries may be expected, for example, due to manufacturing techniques and/or tolerances. Accordingly, embodiments of the present disclosure should not be construed as limited to the specific geometry of the areas illustrated herein, but should include, for example, variations in geometry resulting from manufacturing.

Figure 1:
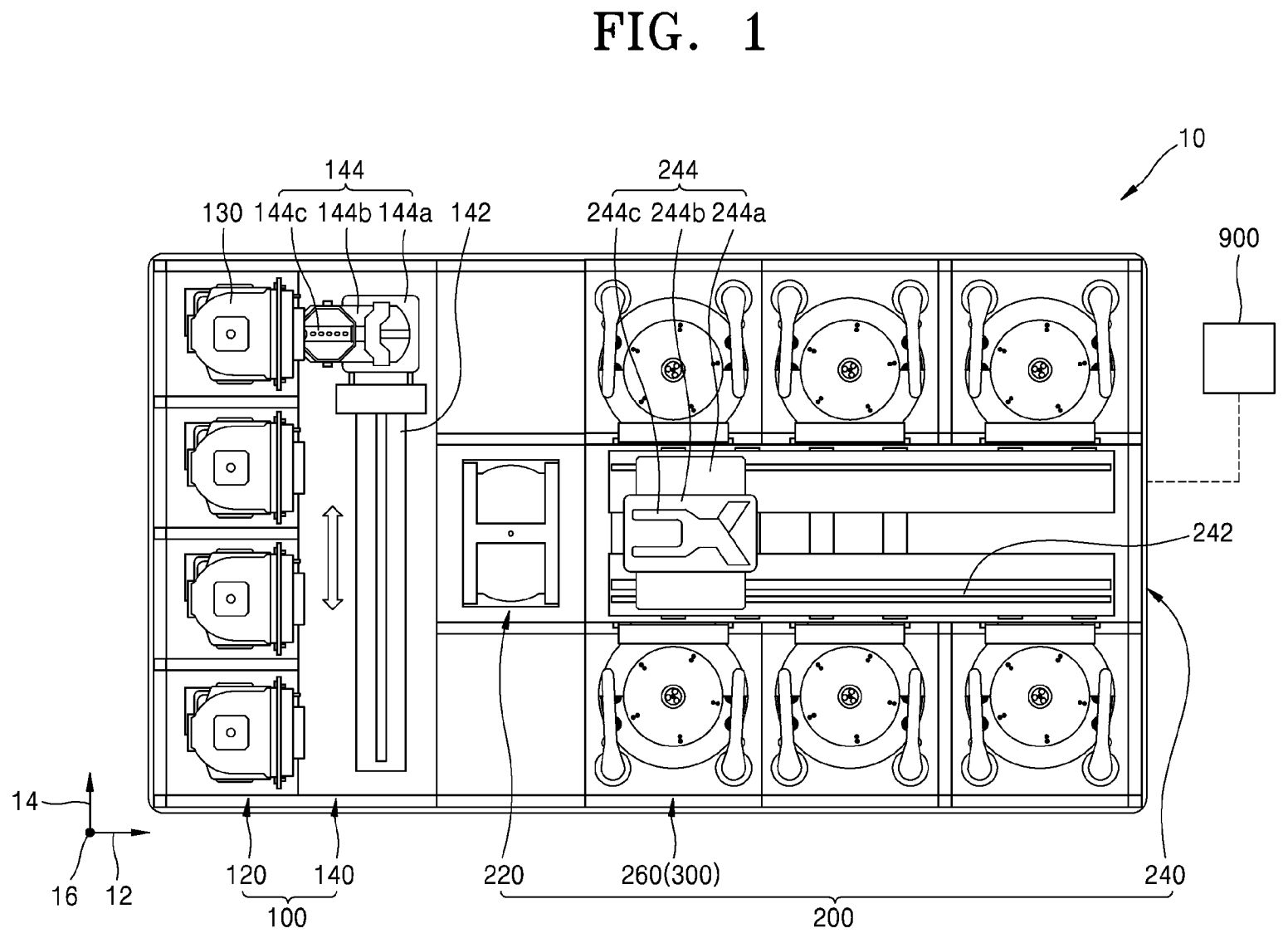

FIG. 1 is a plan view illustrating a substrate processing facility 10 according to some embodiments of the present disclosure.

The substrate processing facility 10 performs a substrate processing process by supplying a processing liquid to the substrate. The substrate processing facility 10 may include a first index module 100 and a first process processing module 200. The controller 900 controls the first index module 100 and the first process processing module 200.

The first index module 100 may include a first load port 120 and a first transfer frame 140. The first load port 120, the first transfer frame 140, and the first process processing module 200 may be sequentially arranged in a row.

Hereinafter, the direction in which the first load port 120, the first transfer frame 140, and the first process processing module 200 are arranged is referred to as a first direction 12. And, when viewed from above, a direction perpendicular to the first direction 12 is referred to as a second direction 14, and a direction perpendicular to a plane including the first direction 12 and the second direction 14 is referred to as a third direction 16.

A first carrier 130 accommodating a substrate such as a wafer may be seated in the first load port 120. A plurality of first load ports 120 may be provided, and they may be arranged in a row along the second direction 14.

While four first load ports 120 are shown in FIG. 1, the number of first load ports 120 may be increased or decreased depending on conditions such as process efficiency and footprint of the first process processing module 200. A slot (not shown) may be formed in the first carrier 130 to support an edge of the substrate.

A plurality of slots may be provided in the third direction 16, and substrates may be positioned within the first carrier 130 such that they are stacked spaced apart from each other along the third direction 16. A front opening unified pod (FOUP) may be used as the first carrier 130.

The first process processing module 200 may include a first buffer unit 220, a first conveyance unit 240, and a first process chamber 260. The first conveyance unit 240 may be disposed such that the longitudinal direction thereof is parallel to the first direction 12. First process chambers 260 may be respectively disposed on one side and the opposite side of the first conveyance unit 240 along the second direction 14. The first process chambers 260 located on one side of the first conveyance unit 240 and the first process chambers 260 located on the other side of the first conveyance unit 240 may be symmetrical to each other with respect to the first conveyance unit 240. Some of the first process chambers 260 may be disposed along the longitudinal direction of the first conveyance unit 240. Also, some of the first process chambers 260 may be stacked on top of each other. That is, the first process chambers 260 may be arranged in an array of n rows and m columns (where n and m are natural numbers) on one side of the first conveyance unit 240. Here, n may be the number of first process chambers 260 provided in a row along the first direction 12, and m may be the number of first process chambers 260 provided in a row along the third direction 16. When four or six first process chambers 260 are provided on one side of the first conveyance unit 240, the first process chambers 260 may be arranged in a 2×2 or 3×2 array. The number of first process chambers 260 may increase or decrease. Unlike the above description, the first process chambers 260 may be provided on only one side of the first conveyance unit 240. Also, unlike the above description, the first process chambers 260 may be provided in a single layer on one side and both sides of the first conveyance unit 240.

The first buffer unit 220 may be disposed between the first transfer frame 140 and the first conveyance unit 240. The first buffer unit 220 may provide a space where the substrate stays before being conveyed between the first conveyance unit 240 and the first transfer frame 140. The first buffer unit 220 is provided with a slot (not shown) in which a substrate is placed, and a plurality of slots spaced apart from each other along the third direction 16 may be provided. In the first buffer unit 220, a side facing the first transport frame 140 and a side facing the first conveyance unit 240 may be open.

The first transfer frame 140 may convey substrates between the first carrier 130 seated at the first load port 120 and the first buffer unit 220. The first transfer frame 140 may be provided with a first index rail 142 and a first index robot 144. The first index rail 142 may be disposed such that the longitudinal direction thereof is parallel to the second direction 14. The first index robot 144 may be installed on the first index rail 142, and may be moved rectilinearly along the first index rail 142 in the second direction 14. The first index robot 144 may include a first base 144a, a first body 144b, and a first index arm 144c. The first base 144a may be installed to be movable along the first index rail 142. The first body 144b may be coupled to the first base 144a. The first body 144b may be arranged to be movable on the first base 144a along the third direction 16. Also, the first body 144b may be arranged to be rotatable on the first base 144a. The first index arm 144c may be coupled to the first body 144b and movable forward and backward with respect to the first body 144b. A plurality of first index arms 144c may be provided and configured to be individually driven. The first index arms 144c are stacked and spaced apart from each other along the third direction 16. Some of the first index arms 144c may be used to convey substrates from the first process processing module 200 to the first carrier 130, and some of the first index arms 144c may be used to convey substrates from the first carrier 130 to the first process processing module 200. Thus, when the first index robot 144 moves substrates in and out, particles generated from the substrates before the process processing may be prevented from being attached to the substrates after the process processing.

The first conveyance unit 240 may convey the substrate W between the first buffer unit 220 and the first process chamber 260 and between plural first process chambers 260. The first conveyance unit 240 may be provided with a first guide rail 242 and a first main robot 244. The first guide rail

242 may be arranged such that the longitudinal direction thereof is parallel to the first direction 12. The first main robot 244 may be installed on the first guide rail 242 and rectilinearly moved on the first guide rail 242 along the first direction 12. The first main robot 244 may include a first base 244a, a first body 244b, and a first main arm 244c. The first base 244a may be arranged to be movable along the first guide rail 242. The first body 244b may be coupled to the first base 244a. The first body 244b may be arranged to be movable on the first base 244a along the third direction 16. Also, the first body 244b may be arranged to be rotatable on the first base 244a. The first main arm 244c may be coupled to the first body 244b and movable forward and backward with respect to the first body 244b. A plurality of first main arms 244c may be provided and configured to be individually driven. The first main arms 244c may be stacked and spaced apart from each other along the third direction 16. The first main arm 244c used to convey the substrate from the first buffer unit 220 to the first process chamber 260 may be different from the first main arm 244c used to convey the substrate from the first process chamber 260 to the first buffer unit 220.

A cleaning process may be performed on the substrate in the first process chamber 260. Each of the first process chambers 260 may have a different structure according to the type of cleaning process. Optionally, the first process chambers 260 may have the same structure. Optionally, the first process chambers 260 may be divided into a plurality of groups, such that first process chambers 260 belonging to the same group have the same structure, and first process chambers 260 belonging to different groups have different structures. For example, when the first process chambers 260 are divided into two groups, the first process chambers 260 of a first group may be provided on one side of the first conveyance unit 240, and the first process chambers 260 of a second group may be provided on the opposite side of the first conveyance unit 240. Optionally, on each of the one side and the opposite side of the first conveyance unit 240, a lower layer may be provided with the first group of first process chambers 260 and an upper layer may be provided with the second group of first process chambers 260. The first group of first process chambers 260 and the second group of first process chambers 260 may each be distinguished according to a type of chemical used and/or a type of cleaning method.

The first process chamber 260 may be provided with a substrate processing apparatus 300, which is described below.

FIG. 2 is a cross-sectional view illustrating a substrate processing apparatus 300 applicable to the substrate processing facility 10 of FIG. 1.

As shown in FIG. 2, the substrate processing apparatus 300 may include a first housing 310, a first container 320, a substrate rotating device 330, a first heating unit 335, an elevating device 360, and a chemical solution supply device 380.

The first housing 310 may provide a substrate processing space therein. Inside the first housing 310, the first container 320 may be located. The first container 320 may provide a processing space in which the substrate processing process is performed. The first container 320 may have an open top. The first container 320 may include a first collection basin 322, a second collection basin 324, and a third collection basin 326.

The collection basins 322, 324, and 326 may collect different processing liquids used in the process. The first collection basin 322 may be formed in the shape of an annular ring to surround the substrate rotating device 330. The second collection basin 324 may be formed in the shape of an annular ring to surround the first collection basin 322. The third collection basin 326 may be formed in the shape of an annular ring to surround the second collection basin 324. The inner space 322a of the first collection basin 322, the space 324a between the first collection basin 322 and the second collection basin 324, and the space 326a between the second collection basin 324 and the third collection basin 326 may function as inlets for introduction of processing liquids into the first collection basin 322, the second collection basin 324, and the third collection basin 326, respectively. Each of the collection basins 322, 324, and 326 may be connected to a collection line 322b, 324b, or 326b extending vertically downward from the bottom thereof.

Each of the collection lines 322b, 324b, and 326b may discharge the processing liquid introduced through the respective collection basins 322, 324, and 326. The discharged processing liquid may be reused via an external processing liquid recycling system (not shown).

The substrate rotating device 330 is disposed within the first container 320. The substrate rotating device 330 supports the substrate W and rotates the substrate W during the substrate treatment process. The substrate rotating device 330 may include a first support plate 332, a first support pin 350, a first chuck pin 340, a heating unit 335, and a first support shaft 338. The first support plate 332 may include a top surface that is formed in a substantially circular shape when viewed from above.

The first support shaft 338, which is rotatable by the first motor 339, may be fixedly coupled to the bottom surface of the first support plate 332. A plurality of first support pins 350 may be provided. The first support pins 350 may be spaced apart at predetermined intervals and disposed at the edge of the top surface of the first support plate 332 and may protrude upward from the first support plate 332. The first support pins 350 may be arranged to collectively form an annular ring shape in combination with each other. The first support pins 350 may support a rear edge of the substrate W such that the substrate W is spaced apart by a certain distance from the top surface of the first support plate 332.

The heating unit 335 may be positioned inside the substrate rotating device 330. The heating unit 335 may be positioned inside the first support plate 332.

The heating unit 335 may heat the substrate W placed on the first support plate 332. For example, the heating unit 335 may be provided as a lamp capable of emitting heat. In one example, the lamp may be an IR lamp. The elevating device 360 includes a first driving unit 366 and first connection units 362, 364 which are connected between the first driving unit 366 and the third collection basin 326. The chemical solution supply device 380 includes a second driving unit 388, second connection units 386, 382 which are connected between the second driving unit 388 and the nozzle 384.

Figure 3:
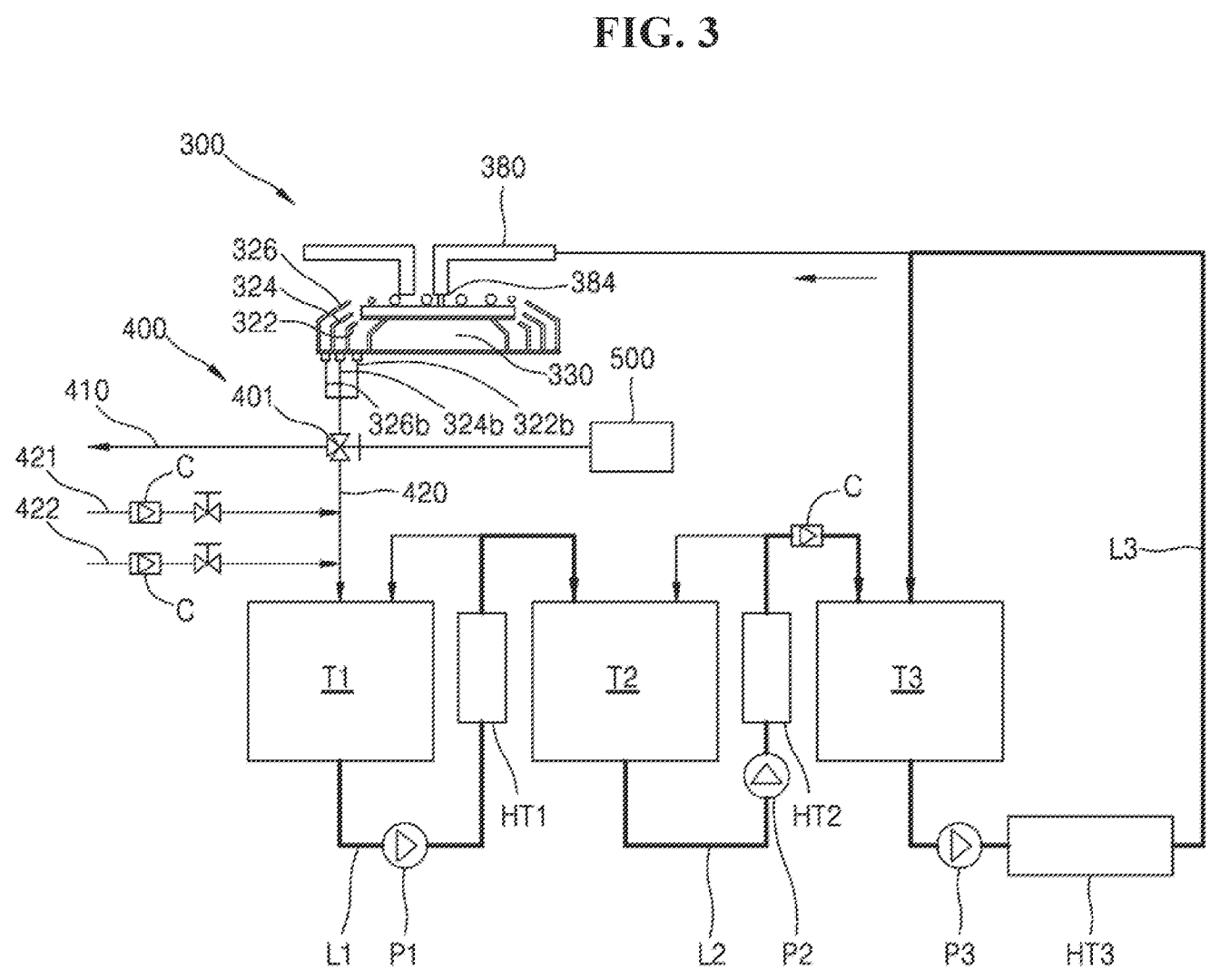

FIG. 3 a hydraulic circuit diagram illustrating the substrate processing apparatus 300 of FIG. 2.

As shown in FIGS. 1 to 3, the substrate processing apparatus 300 according to some embodiments of the present disclosure may include a substrate rotating device 330 configured to rotate a seated substrate W, a chemical solution supply device 380 configured to supply a chemical solution to the substrate W, and a chemical solution discharge line 410 configured to discharge the chemical solution having undergone a process to an outside, a chemical solution circulation line 420 configured to circulate the chemical solution having undergone a process such as an etching process or a cleaning process and circulate the same to the chemical solution supply device 380, and a discharged chemical solution selection device 400 configured to discharge a chemical solution containing a first amount of process by-products to the outside through the chemical solution discharge line 410 and to circulate a chemical solution containing a second amount of process by-products through the chemical solution circulation line 420, wherein the first amount of process by-products is larger than the second amount of process by-products. In the present disclosure, the first amount of process by-products is a relatively large amount of process by-products, and the second amount of process by-products is a relatively small amount of process by-products.

For example, the discharge chemical solution selection device 400 may include a direction control valve 401 configured to discharge, in a chemical solution discharge mode, the chemical solution from a first process containing a relatively large amount of process by-products to the outside through the chemical solution discharge line 410 and to circulate, in a chemical solution circulation mode, the chemical solution containing a relatively small amount of process by-products from a second process through the chemical solution circulation line 420, and a controller 500 configured to apply a chemical solution discharge control signal to the direction control valve 401 in the first process and a chemical solution circulation control signal to the direction control valve 401 in the second process.

Here, the direction control valve 401 may be a three-way valve. In the first process, as the valve body is rotated or moved in the first direction manually or by magnetic force from an electromagnet or the like, the input side connected with at least one chemical solution collection line 322b, 324b, or 326b and a first output side connected with the chemical solution discharge line 410 may be connected. In the second process, as the valve body is rotated or moved in the second direction manually or by magnetic force from an electromagnet or the like, the input side and a second output side in communication with the chemical solution circulation line 420 may be connected.

However, the direction control valve 401 is not necessarily limited to a three-way valve, and any other type of direction control valve capable of switching directions may be applied.

FIG. 7 is a table illustrating a substrate processing method according to some other embodiments of the present disclosure.

As shown in FIGS. 1 to 7, for example, the first process may include an initial etching process of discharging a chemical solution onto the rotating substrate through a nozzle 384 of the chemical solution supply device 380 positioned over a center of the substrate W, or a pre-rinse process of discharging a rinse solution onto the substrate W.

In other words, the initial etching process is a process in which a relatively large amount of process by-products are generated. In this initial etching process, the number of rotations of the substrate may be relatively reduced in order to further increase the initial amount of process by-products to reduce the amount of process by-products in the second process and to reduce the process uniformity and in-wafer scattering in the center and edges of the substrate.

In addition, the rinse process using chemical solutions such as deionized water (DIW), isopropyl alcohol (IPA), and ammonia ($NH_3$), which have been conventionally discarded in the first process and thus have not been recycled due to the relatively large amount of process byproducts, can be fully performed.

For example, the second process may include a first intermediate etching process of discharging the chemical solution onto the rotating substrate W while the nozzle 384 moves in a scanning manner from a position over the center of the substrate W to a position over an edge of the substrate W, and a second intermediate etching process in which the nozzle 384 moves away from a position over the substrate W and the substrate W continues to rotate.

That is, in the first intermediate etching process of discharging the chemical solution while the nozzle 384 moves in a scanning manner and the second intermediate etching process of rotating only the substrate W without discharging the chemical, a relatively small amount of process by-products is produced. At this time, the nozzle 384 may move in a scanning manner in order to remove the remaining amount of process by-products, and the rotations of the substrate may be increased in the intermediate etching processes in to further remove the residual amount.

For example, in the initial etching process, the substrate W may be rotated at a first rotational speed for a first time. In the first intermediate etching process, the substrate W may be rotated at a second rotational speed higher than the first rotational speed for a second time. In the second intermediate etching process, the substrate W may be rotated at a third rotational speed lower than the first rotational speed for a third time. More specifically, for example, as a result of repeated experiments in consideration of the amount of process by-products generated and the amount of substrate etching, the first rotational speed may be less than about 400 revolutions per minute (rpm), the second rotational speed may be greater than about 400 rpm, and the third rotational speed may be less than about 200 rpm. In particular, the first rotational speed may be less than 400 rpm, the second rotational speed may be greater than 400 rpm, and the third rotational speed may be less than 200 rpm.

Therefore, the controller 500 may determine a rotational speed of the substrate W using a determination program or a separate determination circuit, and may apply a chemical solution discharge control signal or a chemical solution circulation control signal to the direction control valve 401 according to the rotational speed of the substrate W.

The controller 500 may also determine a type of a process currently in progress and apply a chemical solution discharge control signal or a chemical solution circulation control signal to the direction control valve 401.

As shown in FIGS. 1 to 7, the discharged chemical solution selection device 400 may further include, in addition to the direction control valve 401 described above, a first collection basin 322 configured to be elevated up to a first height H1 by the elevating device 360, a first chemical solution collection line 322b connected to the first collection basin 322, a second collection basin 324 disposed on an outer side of the first collection basin 322, the second collection basin 324 being configured to be elevated up to a second height H2 greater than the first height H1 by the elevating device 360, a second chemical solution collection line 324b connected to the second collection basin 324, a third collection basin 326 disposed on an outer side of the second collection basin 324, the third collection basin 326 being configured to be elevated up to a third height H3 greater than the second height H2 by the elevating device 360, and a third chemical solution discharge line 326b connected to the third collection basin 326.

Thus, as shown in FIG. 7, the collection basins 322, 324, and 326 may remain lowered during the first process. Then, during the second process, the collection basins 322, 324, and 326 may be elevated using the elevating device 360 to more actively collect the chemical solution for selective recovery.

That is, the controller 500 may apply an elevation control signal to the elevating device 360 to raise and lower the first collection basin 322, the second collection basin 324, and the third collection basin 326 according to the process such that the chemical solution containing a relatively large amount of process by-products is actively discharged to the outside through the chemical solution discharge line 410, and the chemical solution containing a relatively small amount of process by-products is circulated through the chemical solution circulation line 420.

As shown in FIG. 3, the chemical solution circulation line 420 is a three-tank system, including an etchant replenishment line 421 through which etchant is replenished, a deionized water replenishment line 422 through which deionized water is replenished, a first tank T1 configured to firstly store a collected chemical solution, the replenished etchant and the replenished deionized water, a first transport line L1 configured to transport the chemical solution stored in the first tank T1 with a first pump P1 and to correct a temperature of the chemical solution with a first heater HT1 during the transport, a second tank T2 configured to secondly store the chemical solution, a second transport line L2 configured to transport the chemical solution stored in the second tank T2 with a second pump P2 and to correct the temperature of the chemical solution with a second heater HT2 during the transport, a third tank T3 configured to thirdly store the chemical solution, and a third transport line L3 configured to transport the chemical solution stored in the third tank T3 with a third pump P3, correct the temperature of the chemical solution with a third heater HT3 during the transport, and circulate the chemical solution to the chemical solution supply device 380.

Here, the etchant replenishment line 421, the deionized water replenishment line 422, and the second transport line L2 may each be provided with a check valve C to prevent reverse flow, and may be provided with various other types of filters, hydraulic pressure gauges, flow meters, etc.

Therefore, the chemical solution collected in the initial etching process where a large amount of process by-products is generated may be discharged to the outside, and the chemical solution containing a small amount of process by-products may be circulated, thereby reducing the total number of times the chemical solution is replaced due to frequent replenishment of the solution and reducing the waiting time for input. Compared to the conventional method, by which chemical solution change is performed about seven times a day, the chemical solution may be used continuously for a long time, such as 24 hours. In addition, the chemical solution may be circulated in a three-tank system that enables the application of a pre-rinse solution and increases the circulation capacity of the chemical solution. Therefore, the remaining life of the etching function may be greatly improved by frequently warming the chemical solution and keeping the Ti capacity below a certain level.

FIG. 4 is a flowchart illustrating a substrate processing method according to some embodiments of the present disclosure.

As shown in FIG. 4, a substrate processing method according to some embodiments of the present disclosure may include steps of (a) rotating a seated substrate W in a spinning manner, (b) supplying a chemical solution to the substrate W using the chemical solution supply device 380, (c) discharging the chemical solution containing a relatively large amount of process by-products after a process to an outside through the chemical solution discharge line 410, and circulating the chemical solution containing a relatively small amount of process by-products through the chemical solution circulation line 420.

In step (c), in a chemical solution discharge mode, the direction control valve 401 may discharge the chemical solution containing a relatively large amount of process by-products from a first process to the outside through the chemical solution discharge line 410. In the chemical solution circulation mode, the direction control valve 401 may circulate the chemical solution containing a relatively small amount of process by-products from a second process through the chemical solution circulation line 420.

Figure 5:
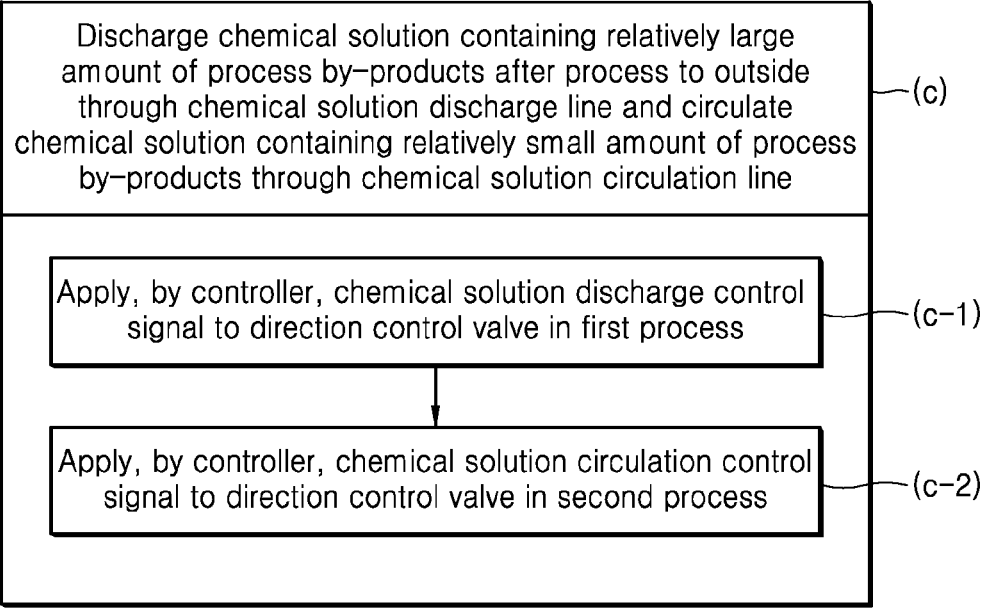
FIG. 5 is a flowchart illustrating step (c) in the substrate processing method of FIG. 4 in more detail.

FIG. 5 is a flowchart illustrating step (c) in the substrate processing method of FIG. 4 in more detail.

As shown in FIG. 5, step (c) may include (c-1) applying, by the controller 500, a chemical solution discharge control signal to the direction control valve 401 in the first process and (c-2) applying, by the controller 500, a chemical solution circulation control signal to the direction control valve 401 in the second process.

Here, step (c-1) may include an initial etching process of discharging a chemical solution onto the rotating substrate W through the nozzle 384 of the chemical solution supply device 380 positioned over a center of the substrate W, or a pre-rinse process of discharging a rinse solution onto the substrate W through the nozzle. Step (c-2) may include a first intermediate etching process of discharging the chemical solution onto the rotating substrate W while the nozzle moves in a scanning manner from a position over the center of the substrate W to a position over an edge of the substrate W, and a second intermediate etching process, in which the nozzle 384 moves away from an area over the substrate W and the substrate W continues to rotate.

For example, in the initial etching process, the substrate W may be rotated at a first rotational speed for a first time. In the first intermediate etching process, the substrate W may be rotated at a second rotational speed higher than the first rotational speed for a second time. In the second intermediate etching process, the substrate W may be rotated at a third rotational speed lower than the first rotational speed for a third time.

Here, the first rotational speed may be less than about 400 rpm, the second rotational speed may be greater than about 400 rpm, and the third rotational speed may be less than about 200 rpm.

For example, in step (c), a first collection basin 322, a second collection basin 324, and a third collection basin 326 may be raised and lowered according to the process to discharge the chemical solution containing a relatively large amount of process by-products to the outside through the chemical solution discharge line 410 and to circulate the chemical solution containing a relatively small amount of process by-products through the chemical solution circulation line 420.

FIG. 6 is a flowchart illustrating step (c-2) in the substrate processing method of FIG. 5 in more detail.

As shown in FIG. 6, step (c-2) may include (c-2-1) firstly storing a collected chemical solution, replenished etchant, and replenished deionized water in a first tank T1, (c-2-2) transporting the chemical solution stored in the first tank T1 with a first pump P1 and correcting a temperature of the chemical solution with a first heater HT1 during the transport, (c-2-3) secondly storing the chemical solution in a second tank T2, (c-2-4) transporting the chemical solution stored in the second tank T2 with a second pump P2 and correcting the temperature of the chemical solution with a second heater HT2 during the transport, (c-2-5) thirdly storing the chemical solution in a third tank T3, and (c-2-6) transporting the chemical solution stored in the third tank T3 with a third pump P3, correcting the temperature of the chemical solution with a third heater HT3 during the transport, and circulating the chemical solution to the chemical solution supply device 380.

Figure 8:
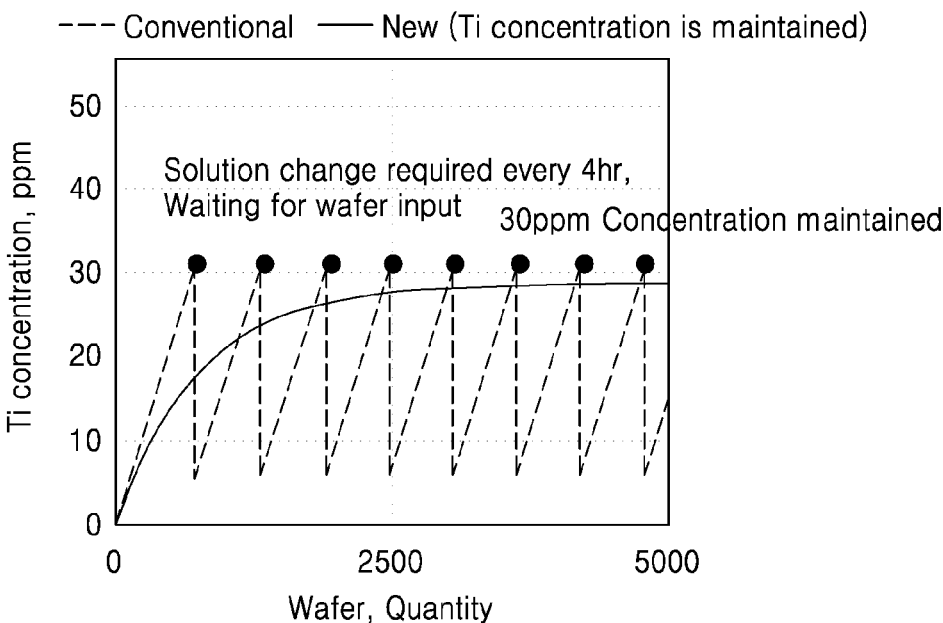
FIGS. 8 and 9 are graphs depicting the effects of a substrate processing apparatus and a substrate processing method according to some other embodiments of the present disclosure.
Figure 9:
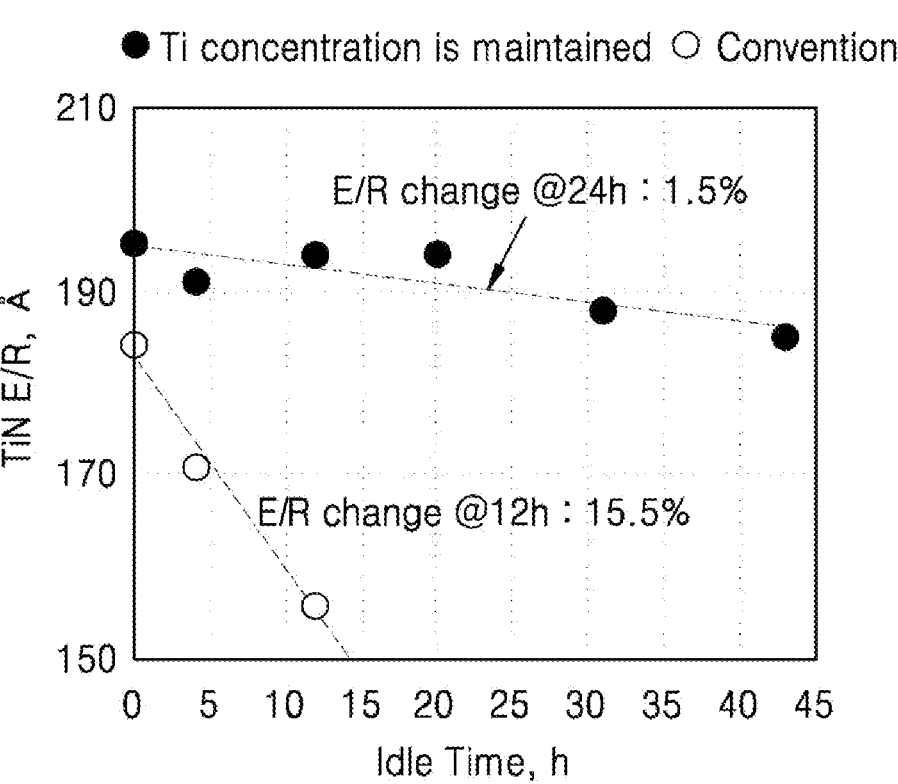

FIGS. 8 and 9 are graphs depicting the effects of a substrate processing apparatus and a substrate processing method according to some other embodiments of the present disclosure.

As shown in FIG. 8, for a conventional in-tank chemical solution change, the time to reach 30 ppm Ti is only 2 to 3 hours, requiring approximately 7 or more chemical solution changes per day. According to the present disclosure, it has been confirmed that Ti can be maintained below 30 ppm for 24 hours, thereby increasing the Unit Per Equipment Hour (UPEH) with only one chemical solution change per day.

Furthermore, according to the present disclosure, as shown in FIG. 9, the decrease in etch rate (E/R) during the idle time of the equipment may be very low, about 1.5 percent after 24 hours.

The reason for maintaining the Ti concentration below 30 ppm is that a concentration higher than 30 ppm may increase the rate of decomposition of the etching components of the etchant, making it difficult to maintain the concentration of the etchant and even causing damage to the equipment.

In addition, with the conventional method of recovering the entire chemical solution, the chemical solution cannot be mixed with other chemical solutions. On the other hand, according to the present disclosure, a chemical solution containing a large amount of process by-products is selectively discarded during the initial period of time, and therefore the chemical solution can be used together with other chemical solutions such as rinse solution.

In addition, as Ti etch by-products increase, the adsorption rate of particles and Ti ions on the wafer increases rapidly, and conventional methods are limited in reducing particles. However, by applying a pre-rinse process, the particles may be reduced. As pre-rinse solutions, chemical solutions such as DI Solved NH3, DIW, and IPA, which have an improvement effect in terms of static electricity, are all applicable.

In addition, another benefit of the present disclosure is that in-wafer scattering is improved. In order to increase the recovery rate of the chemical solution, high-speed rotation is required for efficient separation. However, high-speed rotation may reduce the liquid film on the edge of the wafer, causing a localized decrease in edge etch rate and poor in-wafer scattering. However, according to the present disclosure, in the process section where the initial chemical solution is discarded, a lower rpm can be applied because it is not related to the recovery rate. Therefore, there may be great benefits in improving the scattering.

As is apparent from the above description, the present disclosure provides the following effects.

According to various embodiments of the present disclosure as described above, the chemical solution collected in the initial etching process where a large amount of process by-products is generated may be discharged to the outside, and the chemical solution containing a small amount of process by-products may be circulated, thereby reducing the total number of times the chemical solution is replaced due to frequent replenishment of the solution and reducing the waiting time for input. Compared to the conventional method, by which chemical solution change is performed about seven times a day, the chemical solution may be used continuously for a long time, such as 24 hours. In addition, the chemical solution may be circulated in a three-tank system that enables the application of a pre-rinse solution and increases the circulation capacity of the chemical solution. Therefore, the remaining life of the etching function may be greatly improved by frequently warming the chemical solution and keeping the Ti capacity below a certain level. Of course, the scope of the present disclosure is not limited by these effects.

Although the present disclosure has been described with reference to the embodiments shown in the drawings, these are exemplary only, and those of ordinary skill in the art will appreciate that various modifications and other equivalent embodiments are possible. Therefore, the true scope of the present disclosure should be defined by the appended claims of the present disclosure.

What is claimed is:

1. A system for processing a substrate, the system comprising:

a substrate rotator configured to rotate a seated substrate in a spinning manner;

a chemical solution supplier configured to supply a chemical solution to the substrate;

a chemical solution discharge line configured to discharge the chemical solution having undergone a process to an outside;

a chemical solution circulation line configured to circulate the chemical solution having undergone the process to the chemical solution supplier; and a discharged chemical solution selector configured to discharge a chemical solution containing a first amount of process by-products to the outside through the chemical solution discharge line and to circulate a chemical solution containing a second amount of process by-products through the chemical solution circulation line;

wherein the first amount of process by-products is larger than the second amount of process by-products; and wherein the chemical solution circulation line comprises:

an etchant replenishment line allowing etchant to be replenished therethrough;

a deionized water replenishment line allowing deionized water to be replenished therethrough;

a first tank configured to firstly store a collected chemical solution, the replenished etchant, and the replenished deionized water;

a first transport line configured to transport the chemical solution stored in the first tank with a first pump and correct a temperature of the chemical solution with a first heater during transport;

a second tank configured to secondly store the chemical solution;

a second transport line configured to transport the chemical solution stored in the second tank with a second pump and correct the temperature of the chemical solution with a second heater during transport;

a third tank configured to thirdly store the chemical solution; and a third transport line configured to transport the chemical solution stored in the third tank with a third pump, correct the temperature of the chemical solution with a third heater during transport, and circulate the chemical solution to the chemical solution supplier.

2. The system of claim 1, wherein the process comprises a first process and a second process, wherein the discharged chemical solution selector is a direction control valve configured to discharge, in a chemical solution discharge mode, the chemical solution containing the first amount of process by-products from the first process to the outside through the chemical solution discharge line, wherein the discharged chemical solution selector is a direction control valve configured to circulate, in a chemical solution circulation mode, the chemical solution containing the second amount of process by-products from the second process through the chemical solution circulation line.

3. The system of claim 2, wherein the direction control valve is a three-way valve configured to allow, in the first process, an input side connected to a chemical solution collection line to communicate with the chemical solution discharge line and to allow, in the second process, the input side to communicate with the chemical solution circulation line.

4. The system of claim 2, further comprising:

a controller configured to apply a chemical solution discharge control signal to the direction control valve in the first process and a chemical solution circulation control signal to the direction control valve in the second process.

5. The system of claim 3, wherein the first process comprises:

an initial etching process of discharging a chemical solution onto the rotating substrate through a nozzle of the chemical solution supply device supplier positioned over a center of the substrate; or a pre-rinse process of discharging a rinse solution onto the substrate through the nozzle, wherein the second process comprises:

a first intermediate etching process of discharging the chemical solution onto the rotating substrate while the nozzle moves in a scanning manner from a position over the center of the substrate to a position over an edge of the substrate; and a second intermediate etching process, wherein, in the second intermediate etching process, the nozzle moves away from an area over the substrate and the substrate continues to rotate.

6. The system of claim 5, wherein, in the initial etching process, the substrate is rotated at a first rotational speed for a first time, wherein, in the first intermediate etching process, the substrate is rotated at a second rotational speed higher than the first rotational speed for a second time, wherein, in the second intermediate etching process, the substrate is rotated at a third rotational speed lower than the first rotational speed for a third time.

7. The system of claim 4, wherein the controller determines a rotational speed of the substrate and applies a chemical solution discharge control signal or a chemical solution circulation control signal to the direction control valve.

8. The system of claim 4, wherein the controller determines which process is currently in progress and applies the chemical solution discharge control signal or the chemical solution circulation control signal to the direction control valve.

9. The system of claim 1, wherein the discharged chemical solution selector comprises:

a first collection basin configured to be elevated up to a first height by an elevator;

a first chemical solution collection line connected to the first collection basin;

a second collection basin disposed on an outer side of the first collection basin, the second collection basin being configured to be elevated up to a second height greater than the first height by the elevator;

a second chemical solution collection line connected to the second collection basin;

a third collection basin disposed on an outer side of the second collection basin, the third collection basin being configured to be elevated up to a third height greater than the second height by the elevator; and a third chemical solution collection line connected to the third collection basin.

10. The system of claim 9, wherein the discharged chemical solution selector further comprises:

a controller configured to apply an elevation control signal to the elevator to raise and lower the first collection basin, the second collection basin, and the third collection basin according to the process such that the chemical solution containing the first amount of process by-products is discharged to the outside through the chemical solution discharge line, and the chemical solution containing the second amount of process by-products is circulated through the chemical solution circulation line.

11. An A system for processing a substrate, the system comprising:

a substrate rotator configured to rotate a seated substrate in a spinning manner;

a chemical solution supplier configured to supply a chemical solution to the substrate;

a chemical solution discharge line configured to discharge the chemical solution having undergone a process to an outside;

a chemical solution circulation line configured to circulate the chemical solution having undergone the process to the chemical solution supplier; and a discharged chemical solution selector configured to discharge a chemical solution containing a first amount of process by-products to the outside through the chemical solution discharge line and to circulate a chemical solution containing a second amount of process by-products through the chemical solution circulation line, wherein the first amount of process by-products is larger than the second amount of process by-products, wherein the discharged chemical solution selector is a direction control valve configured to discharge, in a chemical solution discharge mode, the chemical solution containing first amount of process by-products from a first process to the outside through the chemical solution discharge line and to circulate, in a chemical solution circulation mode, the chemical solution containing the second amount of process by-products from a second process through the chemical solution circulation line, the system further comprising:

a controller configured to apply a chemical solution discharge control signal to the direction control valve in the first process and a chemical solution circulation control signal to the direction control valve in the second process, wherein the first process comprises:

an initial etching process of discharging a chemical solution onto the rotating substrate through a nozzle of the chemical solution supplier positioned over a center of a substrate, wherein the second process comprises:

a first intermediate etching process of discharging the chemical solution onto the rotating substrate while the nozzle moves in a scanning manner from a position over the center of the substrate to a position over an edge of the substrate; and a second intermediate etching process, wherein, in the second intermediate etching process, the nozzle moves away from an area over the substrate and the substrate continues to rotate, wherein the discharged chemical solution selector comprises:

a first collection basin configured to be elevated up to a first height by an elevator;

a first chemical solution collection line connected to the first collection basin;

a second collection basin disposed on an outer side of the first collection basin, the second collection basin being configured to be elevated up to a second height greater than the first height by the elevator;

a second chemical solution collection line connected to the second collection basin;

a third collection basin disposed on an outer side of the second collection basin, the third collection basin being configured to be elevated up to a third height greater than the second height by the elevating device elevator; and a third chemical solution collection line connected to the third collection basin, wherein the controller is configured to apply an elevation control signal to the elevator to raise and lower the first collection basin, the second collection basin, and the third collection basin according to the process such that the chemical solution containing the first amount of process by-products is discharged to the outside through the chemical solution discharge line, and the chemical solution containing the second amount of process by-products is circulated through the chemical solution circulation line, wherein the chemical solution circulation line comprises:

an etchant replenishment line allowing etchant to be replenished therethrough;

a deionized water replenishment line allowing deionized water to be replenished therethrough;

a first tank configured to firstly store a collected chemical solution, replenished etchant, and replenished deionized water;

a first transport line configured to transport the chemical solution stored in the first tank with a first pump and correct a temperature of the chemical solution with a first heater during transport;

a second tank configured to secondly store the chemical solution;

a second transport line configured to transport the chemical solution stored in the second tank with a second pump and correct the temperature of the chemical solution with a second heater during transport;

a third tank configured to thirdly store the chemical solution; and a third transport line configured to transport the chemical solution stored in the third tank with a third pump, correct the temperature of the chemical solution with a third heater during transport, and circulate the chemical solution to the chemical solution supplier.

* * * * *